United States Patent [19]

van Deursen

[11] 4,271,530
[45] Jun. 2, 1981

[54] RECEIVER HAVING A FREQUENCY SYNTHESIZING CIRCUIT

[75] Inventor: Theodorus H. M. van Deursen, Eindhoven, Netherlands

[73] Assignee: U.S. Philips Corporation, New York, N.Y.

[21] Appl. No.: 941,370

[22] Filed: Sep. 12, 1978

[30] Foreign Application Priority Data

Oct. 26, 1977 [NL] Netherlands ......................... 7711714

[51] Int. Cl.³ ............................ H04B 1/26; H03J 7/02
[52] U.S. Cl. ..................................... 455/182; 455/183; 455/192; 455/260
[58] Field of Search ................................ 325/418–423, 325/363, 464, 453, 468, 431–433; 455/164, 173, 182, 192, 183, 257–260, 208, 226

[56] References Cited

U.S. PATENT DOCUMENTS 2,856,519 10/1958 Gray et al. ............................ 325/420
4,038,689 7/1977 Rzeszewski et al. ................. 325/421

Primary Examiner—Marc E. Bookbinder
Attorney, Agent, or Firm—Thomas A. Briody; William J. Streeter; Edward W. Goodman

[57] ABSTRACT

In a receiver having a frequency synthesizing circuit, the deviation of the tuning of the intermediate-frequency section relative to a standard tuning is periodically measured by means of a measuring circuit, which circuit then causes a change in the frequency of a local oscillator for correcting said deviation.

3 Claims, 2 Drawing Figures ial signal to the receiver, the receiver is prevented from locking-in to an unwanted transmitter. Using a correction circuit also ensures that, also in the case of the measuring signal is no longer supplied, the local oscillator of the receiver can be kept tuned very accurately to the frequency of the desired transmitter, without an automatic frequency control circuit.

RECEIVER HAVING A FREQUENCY SYNTHESIZING CIRCUIT

BACKGROUND OF THE INVENTION

The invention relates to a receiver having a frequency synthesising circuit comprising a reference oscillator, said receiver also having a radio-frequency section, a local oscillator and an intermediate frequency section, the local oscillator being tunable by means of the reference oscillator to a frequency which adjusts the intermediate frequency to a standard intermediate frequency.

Funkschau 1976 volume 20, pages 839–842, discloses a receiver of the type defined above. In that receiver the frequency of the local oscillator is coupled to the frequency of an extremely stable reference oscillator, so that a very constant oscillator tuning is obtained. However, it is not possible, as is characteristic of receivers without frequency synthesising, to compensate for any variation in the tuning of the intermediate frequency section by causing compensating frequency variations of the local oscillator to be produced.

It would be possible to perform such a correction by means of an automatic frequency control circuit acting on a received signal. However, there is the risk that said circuit locks-in to an unwanted transmitter.

SUMMARY OF THE INVENTION

It is an object of the invention to provide a different method for correcting the oscillator frequency so that locking-in to an unwanted transmitter is prevented.

A receiver of the type defined in the preamble is therefore characterized in that the receiver, comprises a measuring circuit for temporarily applying, instead of a signal to be received, a measuring signal to an input of the radio-frequency or intermediate-frequency section of the receiver, changing the frequency of the measuring signal or of the local oscillator signal, and measuring the frequency to which the intermediate-frequency section is turned. The receiver furthermore comprises a correction circuit for temporarily processing the measured frequency, to which the intermediate-frequency section is tured, into a tuning datum for the frequency synthesising circuit.

By temporarily supplying a measuring signal instead of an aerial signal to the receiver, the receiver is prevented from locking-in to an unwanted transmitter. Using a correction circuit also ensures that, also in the case of the measuring signal is no longer supplied, the local oscillator of the receiver can be kept tuned very accurately to the frequency of the desired transmitter, without an automatic frequency control circuit.

DESCRIPTION OF THE DRAWINGS

The invention will now be further explained with reference to the drawing.

In the drawing.

DESCRIPTION OF THE PREFERRED EMBODIMENT

Figure 1:
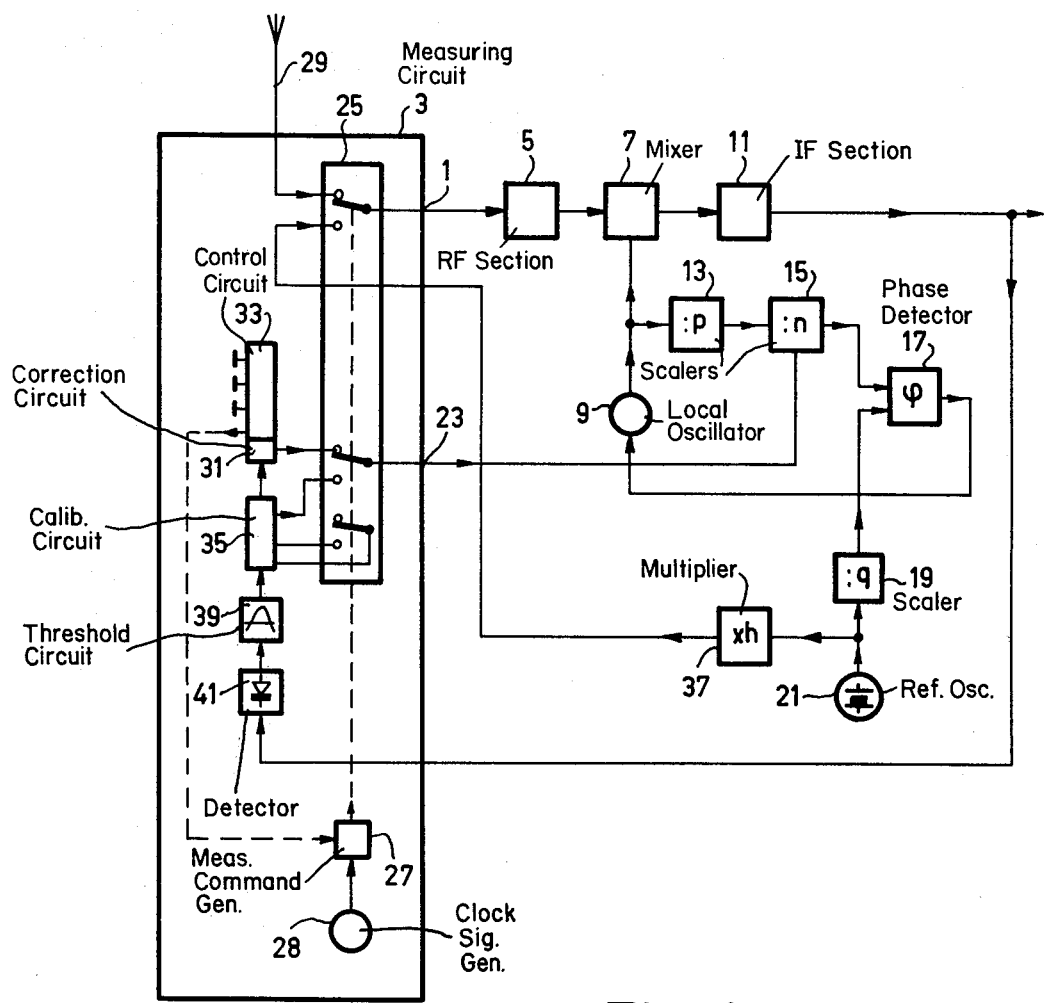
FIG. 1 illustrates by means of a concise block diagram a receiver according to the invention and FIG. 2 illustrates by means of a block diagram a portion of a measuring circuit for a receiver according to the invention.

In FIG. 1 a signal, from an output 1 of a measuring circuit 3, is applied via a radio-frequency section 5 to a mixer stage 7. In addition a second signal, supplied by a local oscillator 9, is applied to the mixer stage 7. The output signal of the mixer stage 7 is applied to an intermediate-frequency section 11.

The local oscillator 9 forms a part of a frequency synthesising circuit. The output signal of the oscillator 9 is applied to a first input of a phase detector 17 via a pre-scaler 13, which divides by a fixed value p, and a scaler 15, which divides by an adjustable value n. A second input of the phase detector 17 is supplied with a reference signal, via a scaler 19 which divides by q, from a reference oscillator 21 operating at a frequency $f_{ref}$. The output signal of the phase detector 17 controls the frequency $f_{osc}$ of the oscillator 9, or $(1/p)\cdot(1/n)f_{osc}=(1/q)f_{ref}$ so that $f_{osc}=n(p/q)f_{ref}$. Therefore, the adjustable value n determines the frequency to which the oscillator 9 is tuned. This value n is adjustable by means of a group of signals obtained via a group of leads from a group of outputs 23 of the measuring circuit 3. For clarity, these groups are shown as a single line in FIG. 1.

The measuring circuit 3 has a switch 25 which can be operated by a measuring command generator 27. The measuring command generator 27 is controlled by a clock signal generator 28 which supplies a signal periodically, for example every ten minutes, with which the switch 25 is adjusted, for a brief period of time, to the second position not shown in FIG. 1.

With the switch 25 in the first position as shown in FIG. 1, a signal, originating from an aerial 29, is available at the output 1 and a group of signals originating from a correction circuit 31 is applied to the group of outputs 23. The correction circuit 31 serves for correcting a tuning datum, supplied by a control circuit 33, for a change of the frequency to which the intermediate-frequency section 11 is tuned relative to a standard intermediate frequency. This change can, for example, occur due to temperature variations, aging or inaccuracy during the adjustment.

The datum with which the tuning datum is corrected is derived from a calibration circuit 35 with which the change from the standard intermediate frequency is determined.

This occurs in the second position of the switch 25. A signal, which is obtained from the reference oscillator 21 via a frequency multiplier 37, is applied to the output 1 of the measuring circuit via the upper set of contacts in the second position of the switch 25. Since the frequency multiplication factor of the frequency multiplier is h, the frequency of the signal applied to the radio-frequency section 5 is h $f_{ref}$ when the switch 25 is in the second position thereof.

By means of the second set of contacts of the switch 25 in the second position thereof which symbolises a group of contacts, a tuning datum is applied to the group of outputs 23. The tuning datum is varied, due to the closing of a third set of contacts of the switch 25 in the second position thereof, from the oscillator 9 frequency, corresponding to the desired intermediate frequency, to a lower value, until it is determined, by means of a threshold circuit 39, that the amplitude of an intermediate frequency signal, as detected by a detector 41, exceeds a given threshold value. Thereafter, the tuning datum at the group of outputs 23 is changed so that the oscillator 9 frequency increases until the threshold circuit 39 again indicates that the threshold value is exceeded. The tuning datum, located halfway between the two tuning data at which the threshold value is exceeded, is the correct tuning datum and the change thereof relative to the tuning datum associated with the desired oscillator 9 frequency is determined and applied to the correction circuit 31, whereby the tuning data for transmitters to be received are corrected.

For the circuit discussed above, h may be taken as twenty-seven for an FM-receiver having a reference oscillator 21 operating at 4 MHz. The frequency of the measuring signal then becomes 108 MHz and the non-corrected oscillator frequency 118.7 MHz, if the standard intermediate frequency is 10.7 Mhz.

If an intermediate frequency signal is applied instead of a radio-frequency signal, then this may be done by switching-off the H.F. input signal and by tuning the local oscillator 9 to a suitable frequency. For a standard intermediate frequency of 10.7 MHz the frequency of the local oscillator 9 can, for example, be varied around $10.7/2 = 5.35$ MHz for determining the frequency to which the intermediate frequency section is tuned.

For an A.M.-receiver having a standard intermediate frequency of 460 KHz and a reference oscillator frequency of 4 MHz the frequency of the measuring signal can be taken as 4 MHz (h=1) and the oscillator frequency can be varied around 4.46 MHz.

Instead of the detector 41 and the threshold circuit 39, it is alternatively possible to use, for example, a frequency discriminator having a zero-crossing indicator. The zero-crossing frequency must then be determined with the calibration circuit 35.

If so desired, the measuring command generator 27 can be coupled to the control circuit 33 in such a way that a measuring cycle is performed a given period of time after the receiver has been switched-on.

If the measuring signal applied is at the radio frequency, it is in principle possible to vary the frequency of this measuring signal instead of the oscillator signal. If so desired, the measuring signal can alternatively be obtained from a separate oscillator. However, the methods described above are, in general, simpler to be performed.

Figure 2:
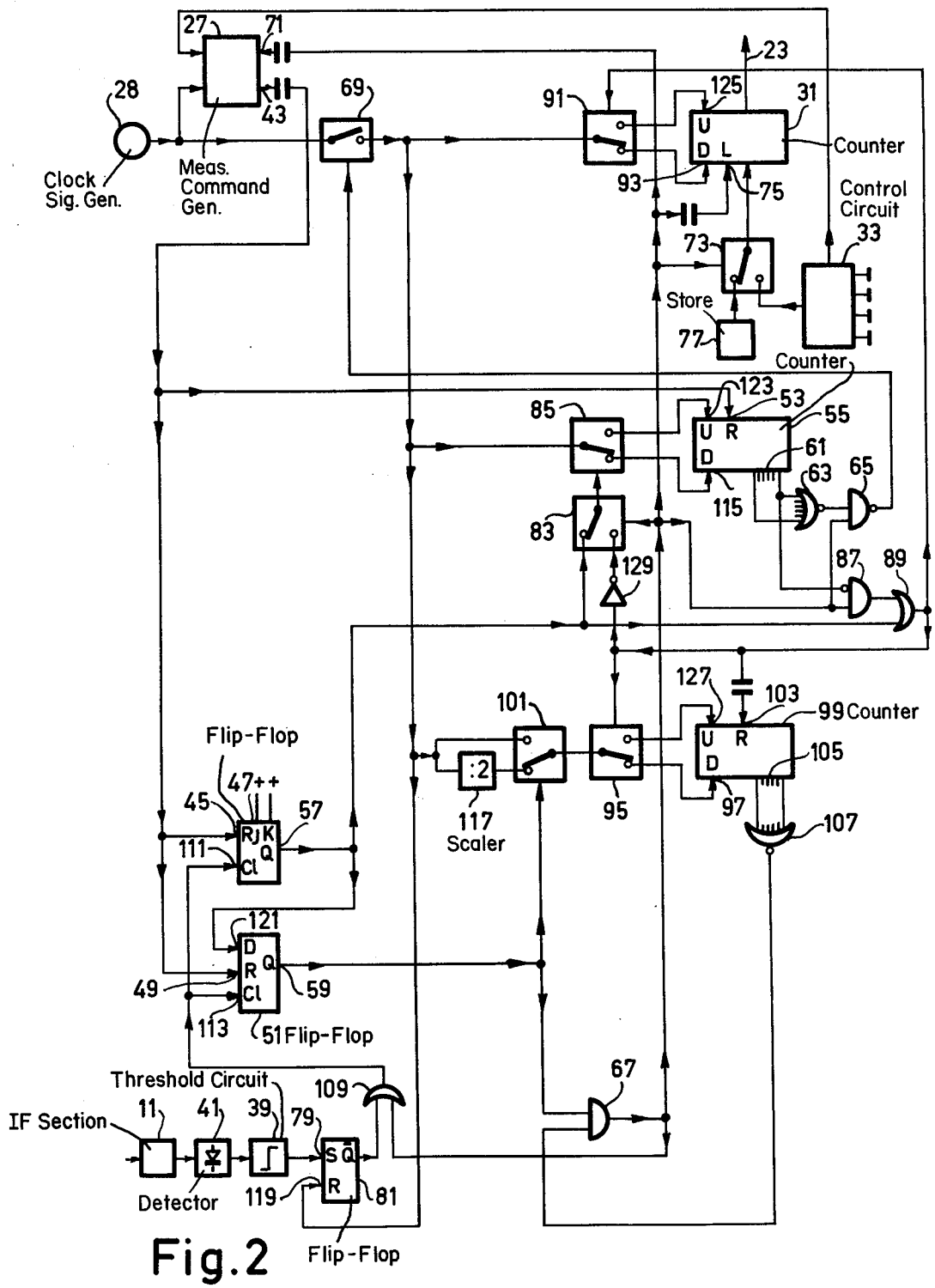

In FIG. 2 components corresponding to components in FIG. 1 have been given the same reference numerals. FIG. 2 does not show the switching-over of the input to the radio-frequency section 5 of FIG. 1. FIG. 2 shows an embodiment of the remaining part of the measuring circuit 3 of FIG. 1.

As indicated above, the measuring command generator 27 is controlled by the clock signal generator 28 and the control circuit 33. The group of outputs 23 from the correction circuit (counter) 31 supplies a group of tuning data to the adjustable scaler 15 of FIG. 1.

When the output 43 of the measuring command generator 27 supplies a measuring command signal to a reset input 45 of a flip-flop 47, to a reset input 49 of a flip-flop 51 and to a reset input 53 of a counter 55, which counter 55 serves as an error store. The outputs 57, 59 of the flip-flops 47, 51 respectively then become zero. The counter 55 has a group of outputs 61 which then all become zero too. A NOR-gate 63 connected to the outputs 61 then supplies an output signal one to a NAND-gate 65, another input of which receives an output signal of an AND-gate 67, which is zero at this moment. The output signal of the NAND-gate 65 then becomes one and closes a switch 69, causing clock pulses to be applied to various sections of the circuit.

The output of the AND-gate 67 is zero because an input thereof is connected to the output 59 of the flip-flop 51 and this output 59 has become zero at the start of the measuring cycle.

The output signal zero of the AND-gate 67 is further supplied to a reset input 71 of the measuring command generator 27, so that said generator 27 is reset.

The output signal of the AND-gate 67 furthermore adjusts a change-over switch 73 to the position shown in the drawing, as a result of which, due to the output signal of the AND-gate 67, which is also applied to a writing signal input 75 of the counter 31, a group of tuning data from a store 77 is entered into the counter 31. This tuning data is applied to the group of outputs 23 as a result of which the frequency synthesising circuit tunes to a frequency corresponding to the frequency of the output signal of the multiplier 37 of FIG. 1, so that a signal having the standard intermediate frequency is applied to the intermediate frequency section 11. This causes the threshold circuit 39 to supply an output signal one to a setting input 79 of a flip-flop 81. The reset input of this flip-flop 81 is connected to the output of the switch 69 and receives clock pulses.

Under the influence of the output signal zero of the AND-gate 67 a switch 83 is adjusted to the position shown in the drawing, which causes the output signal of the flip-flop 47 to be fed to a switch 85 which is adjusted to the position shown in the drawing. Furthermore, the output signal of the AND-gate 67 is applied to an input of AND-gate 87, to another input of which the inverted signal of the most significant output of the group of outputs 61 of the counter 55 is applied. The output of the AND-gate 87 is connected to an input of an OR-gate 89, the other input of which is connected to the output 57 of the flip-flop 47. The output signal of the AND-gate 87 is zero because the output signal of the AND-gate 67 is zero. The output signal of the OR-gate 89 is also zero because its two inputs signals are zero.

The output signal zero of the OR-gate 89 moves a switch 91 to the position shown in the drawing, which causes the clock signal from the output of the switch 69 to be fed to the down-counting input 93 of the counter 31. Furthermore, the output signal of the OR-gate 89 adjusts a switch 95 to the position shown in the drawing, causing a down-counting input 97 of a counter 99 to be connected to an output of a change-over switch 101. The switch 101 is operated by the signal originating from the output 59 of the flip-flop 51 and is, consequently, adjusted to the position shown in the drawing.

A reset input 103 of the counter 99 is connected via a capacitance to the output of the OR-gate 89. A group of outputs 105 of the counter 99 is connected to a further input of the AND-gate 67 through a NOR-gate 107. If the counter 99 is in a zero position, its outputs 105 are zero and the output signal of the NOR-gate 107 is one.

Furthermore, a signal is applied from the output of AND-gate 67 to an OR-gate 109, to a further input of which the output signal of the flip-flop 81 is applied. This output signal is zero because this flip-flop 81 is kept in the set state by the voltage at its input 79. The output of the OR-gate 109 is connected to the clock signal inputs 111, 113 of the flip-flops 47, 51.

In the position, shown in FIG. 2, obtained by starting a measuring cycle, clock pulses are now applied through the switch 91 to the counting-down input 93 of the counter 31 so that the tuning frequency is reduced, through the switch 85 to a counting-down input of the counter 55, via a two-scaler 117 and the switches 101 and 95 to the counting-down input of the counter 99 and to a resetting input 119 of the flip-flop 81.

However, this flip-flop 81 remains set for the time its setting input 79 is high.

The further progress of the measuring cycle is now determined in the first place by the flip-flop 81. If the threshold circuit 39 indicates that a threshold is exceeded and brings the voltage at the setting input 79 of the flip-flop 81 from one to zero, the output of the flip-flop 81 becomes high at the next clock pulse at the resetting input 119.

The flip-flop 81 is of the set-reset type and supplies a positive pulse at its output, said pulse being passed-on to the inputs 111 and 113 of the flip-flops 47, 51 through the OR-gate 109. The flip-flop 47 is of the JK-type, the J- and K-input being connected to a positive voltage. This flip-flop 47 changes state due to the signal at its input 111 and its output 57 becomes one. The flip-flop 51 is of the D-type and takes-over, at the instant the positive pulse at the input 113 occurs, the signal value at its D-input 121, which is connected to the output 57 of the flip-flop 47. This value was zero and, consequently, the output 59 of the flip-flop 51 remains zero.

As a result of the fact that the output 57 of the flip-flop 47 becomes one, the switch 85 is switched to the position not shown in the drawing, so that an upcounting input 123 of the counter 55 is connected to the output of the switch 69. The output signal of the OR-gate 89 also becomes one so that the switch 91 is switched to the position not shown in the drawing and an upcounting input 125 of the counter 31 is connected to the output of the switch 69. Also the switch 95 is switched to the position not shown in the drawing as a result of the fact that the output signal of the OR-gate 89 becomes one. As a consequence, an up-counting input 127 of the counter 99 is fed with clock pulses through the two-scaler 117. Furthermore, the counter 99 is reset as a result of the fact that its input 103 counts one. The position of the counter 31 is now (a tuning number $-A$), that of the counter 55 is ($-A$) and that of the counter 99 is zero if A clock pulses have occurred between the start and the change in state.

The counters 31, 55 and 99 now count upwards till the threshold circuit 39 again supplies a downgoing signal after B clock pulses. The flip-flop 81 supplies a pulse again to the OR-gate 109 which passes this pulse on to the inputs 111, 113 of the flip-flops 47, 51. The flip-flop 51 now takes over the output signal one of the flip-flop 47 so that its output 59 becomes one and the flip-flop 47 changes state again so that its output 57 becomes zero.

The position of the counter 31 is now (tuning datum $-A+B$), that of the counter 55 is ($-A+B$) and that of the counter 99 is ($+B/2$). The output signals of the counter 99 now cause the output of the NOR-gate 107 to become zero so that the input of the AND-gate 67, connected thereto, becomes zero and the output signal thereof remains zero.

As a result of the fact that the output signal of the flip-flop 51 becomes one, the switch 101 is changed-over so that it now directly passes pulses of the clock frequency. The output signal of the OR-gate 89 becomes zero again so that the switch 95 returns to the position shown in the drawing. The switch 85 also returns to the position shown in the drawing, which also holds for the switch 91.

The counters 31, 55 and 99 now count B/2 clock pulses downwards, which causes the output signal of the NOR-gate 107 to become one, the output signal of the AND-gate 67 also becoming one as the other input thereof remains one because the state of the flip-flops 81, 47, 51 has now changed.

The counter 55 now contains the number $(-A+(B/2))$ indicating how much the tuning of the measured intermediate frequency deviates relative to the standard intermediate frequency. This number must now be introduced as a correction in the tuning datum for a transmitter to be received. This is done under the influence of the gates 63, 65, 67, 87, 89.

Due to the fact that the output of the AND-gate 67 becomes one, the switch 83 is adjusted to the position not shown in the drawing. The switch 85 is now operated by the output signal of the OR-gate 89 and, due to an inverter circuit 129, in the opposite sense relative to the switch 91. Also the switch 73 is adjusted to the position not shown in the drawing and a tuning number for a desired transmitter is now entered into the counter 31 as a result of the signal at the writing input 75.

If the counter 55 has a negative content, its most significant output is one, this output being zero in the case of a positive content. The AND-gate 87 then supplies a signal zero when the content of the counter is negative, and a one when the content is positive. This signal is passed by the OR-gate 89. The counters 31 and 55 now run in the opposite sense. If the content of the counter 55 was positive, the counter 55 counts down and the counter 31 counts upwards. The reverse occurs with a negative content of the counter 55.

If the content of the counter 55 has become zero, the output of the OR-gate 63 becomes one and, consequently, the output of the NAND-gate 65, and the switch 69 is adjusted to the position now shown in the drawing, which causes the counters to stop. The tuning datum in the counter 31 has then been corrected for a deviation in the tuning of the intermediate frequency section relative to a standard intermediate frequency.

Although in the preceding a receiver having a frequency synthesising circuit with an adjustable scaler was discussed, it will be obvious that the measure according to the invention is also possible for other types of frequency synthesising circuits for which the tuning datum must be entered in the form of a number.

In addition, it will be obvious that processing the measured deviation of the intermediate frequency relative to a standard intermediate frequency into the tuning datum can be effected in a different manner, if so desired.

Parts of a receiver according to the invention of course may be realised with the aid of a processor and may be present only temporarily as a processor alternatingly constructs circuits for performing different functions under control of a program using a same unit for that different function.

What is claimed is:

1. A receiver having a radio-frequency section, an intermediate section and a frequency synthesising circuit comprising both a reference oscillator and a local oscillator for tuning said receiver to one of several transmitter frequencies for reception thereof, the local oscillator being tunable, independently from the frequency of a received signal, to a frequency, determined by a tuning datum, which deviates the intermediate frequency from a frequency value corresponding to the frequency of a transmitter to be received, wherein the receiver comprises a measuring circuit having means for applying a measuring signal, instead of a signal to be received, to an input of the radio-frequency section of the receiver, means for changing the frequency of the local oscillator signal independently from the frequency of the signal to be received and means for measuring the center frequency at the output of the intermediate-frequency section, the receiver furthermore comprising a correction circuit for processing the measured frequency, to which the intermediate-frequency section is tuned, into the tuning datum for the frequency synthesising circuit.

2. A receiver as claimed in claim 1 wherein the measuring signal is derived from said reference oscillator.

3. A receiver as claimed in claim 1, or 2, wherein the measuring circuit is periodically activated.

* * * * *